US006685306B2

(12) United States Patent
Sugahara

(10) Patent No.: US 6,685,306 B2
(45) Date of Patent: Feb. 3, 2004

(54) LIQUID DROPLET EJECTION DEVICE

(75) Inventor: Hiroto Sugahara, Ama-gun (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 130 days.

(21) Appl. No.: 10/100,045

(22) Filed: Mar. 19, 2002

(65) Prior Publication Data

US 2002/0140786 A1 Oct. 3, 2002

(30) Foreign Application Priority Data

Mar. 30, 2001 (JP) ........................................ 2001-098708
Apr. 17, 2001 (JP) ........................................ 2001-118130

(51) Int. Cl.[7] ........................... B41J 2/045; H01L 41/04
(52) U.S. Cl. ........................................... 347/72; 310/328
(58) Field of Search ............................... 347/68, 70–72; 310/328

(56) References Cited

U.S. PATENT DOCUMENTS

| | | | |
|---|---|---|---|
| 5,128,694 A | 7/1992 | Kanayama | |
| 5,266,964 A | 11/1993 | Takahashi et al. | |
| 5,402,159 A | 3/1995 | Takahashi et al. | |
| 5,465,108 A | 11/1995 | Fujimoto | |

FOREIGN PATENT DOCUMENTS

| | | | | |
|---|---|---|---|---|
| JP | 58-108163 A | * | 6/1983 | 347/71 |
| JP | 63-104843 A | * | 5/1988 | 347/68 |
| JP | 01-204748 A | * | 8/1989 | 347/70 |
| JP | A 5-169653 | | 7/1993 | |
| JP | A 7-137254 | | 5/1995 | |
| JP | 10-034922 A | * | 2/1998 | B41J/2/045 |

* cited by examiner

*Primary Examiner*—Judy Nguyen
(74) *Attorney, Agent, or Firm*—Oliff & Berridge, PLC

(57) ABSTRACT

A piezoelectric actuator providing a deformation of a liquid chamber wall at a reduced driving voltage applied to electrodes. A piezoelectric plate member is provided in which electrodes are embedded at predetermined spaced relation in an extending direction of the plate member. A liquid chamber plate is provided immediately below the plate member. The chamber plate is formed with a plurality of through holes arrayed in the predetermined spaced relation corresponding to the array of the electrodes. A second liquid chamber plate is provided immediately below the first chamber plate. A nozzle plate is provided immediately below the second liquid chamber plate. The nozzle plate is formed with nozzles arrayed in the spaced relation and corresponding to the array of the through holes. A combination of the above segments provides liquid chambers arrayed in the extending direction. Vacant zones such as notches are formed at an outer surface of the piezoelectric plate member and at a position in alignment with the through holes. Secondary vacant zones or notches are formed at an inner surface of the plate member and at a position adjacent the through holes.

26 Claims, 9 Drawing Sheets

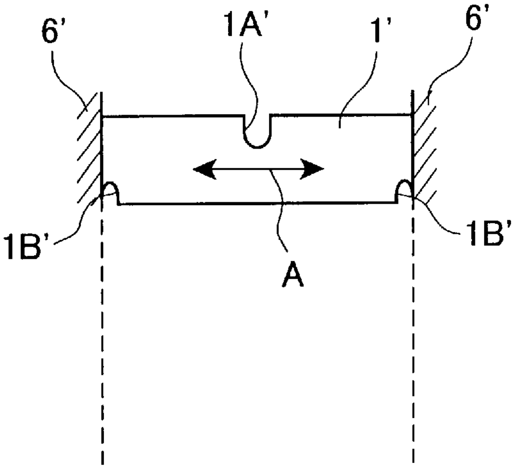
FIG.5(a)
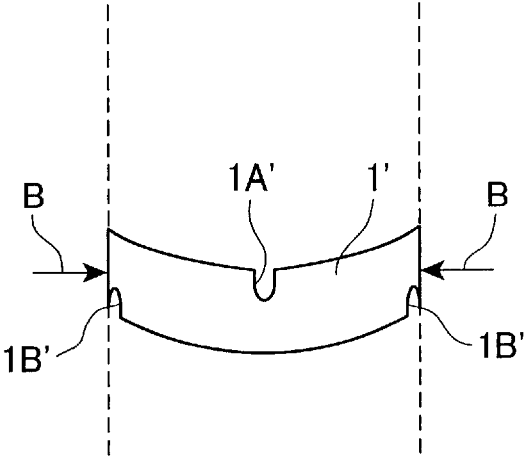
FIG.5(b)
FIG.10
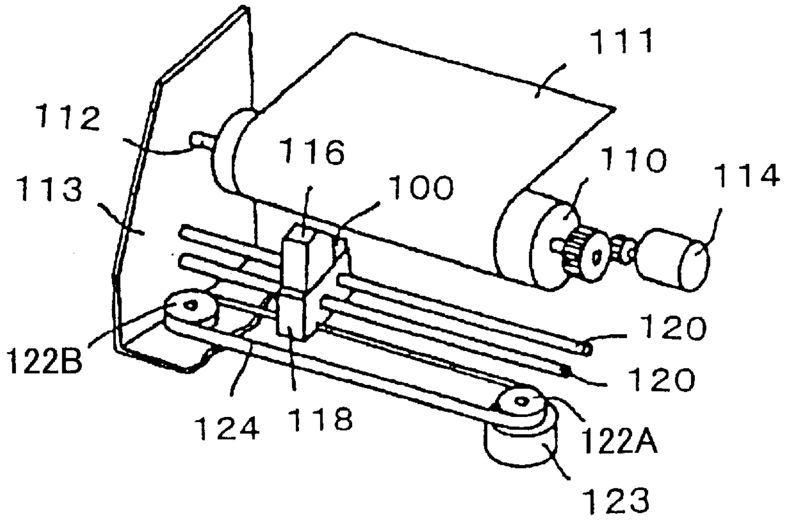

LIQUID DROPLET EJECTION DEVICE

BACKGROUND OF THE INVENTION

The present invention relates to a liquid droplet ejection device, and more particularly, to a piezoelectric actuator deformable to change an internal volume of an liquid chamber, such as an ink chamber of an ink jet printer head.

A liquid droplet ejection device is conventionally used as a printer head of an ink jet type printer. In such type of the printer head, a plate like piezoelectric plate member is provided as a part of a wall of an ink chamber. Upon application of a drive voltage to the piezoelectric plate member, the wall is deformed to induce pressure waves to the ink contained in the ink chamber. Thus, ink can be ejected out of a nozzle in communication with the ink chamber.

In order to sufficiently deform the wall portion for providing sufficient ink ejection, high driving voltage is required. However, application of high driving voltage is detrimental to energy consumption.

SUMMARY OF THE INVENTION

It is an object of the present invention to overcome the above-described problem and to provide an energy saving liquid droplet ejection device capable of providing a sufficient deformation of the piezoelectric plate member even at a low driving voltage.

This and other objects of the present invention will be attained by a piezoelectric actuator including an improved piezoelectric plate member and electrodes. The piezoelectric plate member is formed of a piezoelectric material and has a first surface and a second surface opposite to the first surface in a thickness direction of the piezoelectric plate member. The piezoelectric plate member is fixed at fixed positions spaced away from each other in an extending direction of the piezoelectric plate member. The electrodes are adapted for deforming the piezoelectric plate member. Each electrode is positioned for imparting an electric field to the piezoelectric plate member so as to expand a part of the piezoelectric plate member in the extending direction, the part being defined between neighboring fixed positions of the piezoelectric plate member. A vacant zone is positioned at a position deviating to one of the first and second surfaces at a position between the neighboring fixed positions. Expansion force of the part of the piezoelectric plate member in the extending direction causes the part to be bendingly deformed between the neighboring fixed positions.

In another aspect of the invention, there is provided a liquid droplet ejection device including the piezoelectric actuator and a liquid chamber constituting member defining a liquid chamber in cooperation with the part of the piezoelectric plate member. Each fixed position is positioned adjacent to a contour of the liquid chamber. Deformation of the part of the piezoelectric plate member provides a volumetric change of the liquid chamber.

In still another aspect of the invention, there is provided a piezoelectric ink jet printer head including a piezoelectric plate member, an ink chamber plate, a nozzle plate and electrodes. The piezoelectric plate member is formed from a piezoelectric material and has a first surface and a second surface opposite to the first surface in a thickness direction of the piezoelectric plate member. The piezoelectric plate member extends in an extending direction. The ink chamber plate is positioned directly below the piezoelectric plate member, and is formed with a plurality of holes arrayed in the extending direction. The piezoelectric plate member is fixed to solid portions of the ink chamber plate other than the holes. The nozzle plate is positioned below the ink chamber plate and is formed with a plurality of nozzles arrayed in the extending direction and positioned in alignment with the holes. A combination of the piezoelectric plate member, the ink chamber plate and the nozzle plate defines a plurality of ink chambers arrayed in the extending direction. The electrodes are adapted for deforming the piezoelectric plate member. Each electrode is positioned for imparting an electric field to the piezoelectric plate member so as to expand a part of the piezoelectric plate member in the extending direction, the part being defined in confrontation with the ink chamber. Vacant zones are positioned at positions deviating to one of the first and second surfaces and each vacant zone is positioned within an area of each hole. Expansion force of the part of the piezoelectric plate member in the extending direction causes the part of the piezoelectric plate member to be bendingly deformed toward or away from the ink chamber.

BRIEF DESCRIPTION OF THE DRAWINGS

In the drawings:

FIG. 5(*a*) is a view for description of deformation principle of a piezoelectric plate member according to the first embodiment;

FIG. 5(*b*) is a view for description of deformation principle of a piezoelectric plate member according to the first embodiment and showing a deformed state of the piezoelectric plate member;

FIG. 10 is a schematic perspective view showing an essential portion of an ink jet printer incorporating the ink jet printer head of the present invention.

DETAILED DESCRIPTION OF THE PREFERRED EMBODIMENTS

Figure 1:
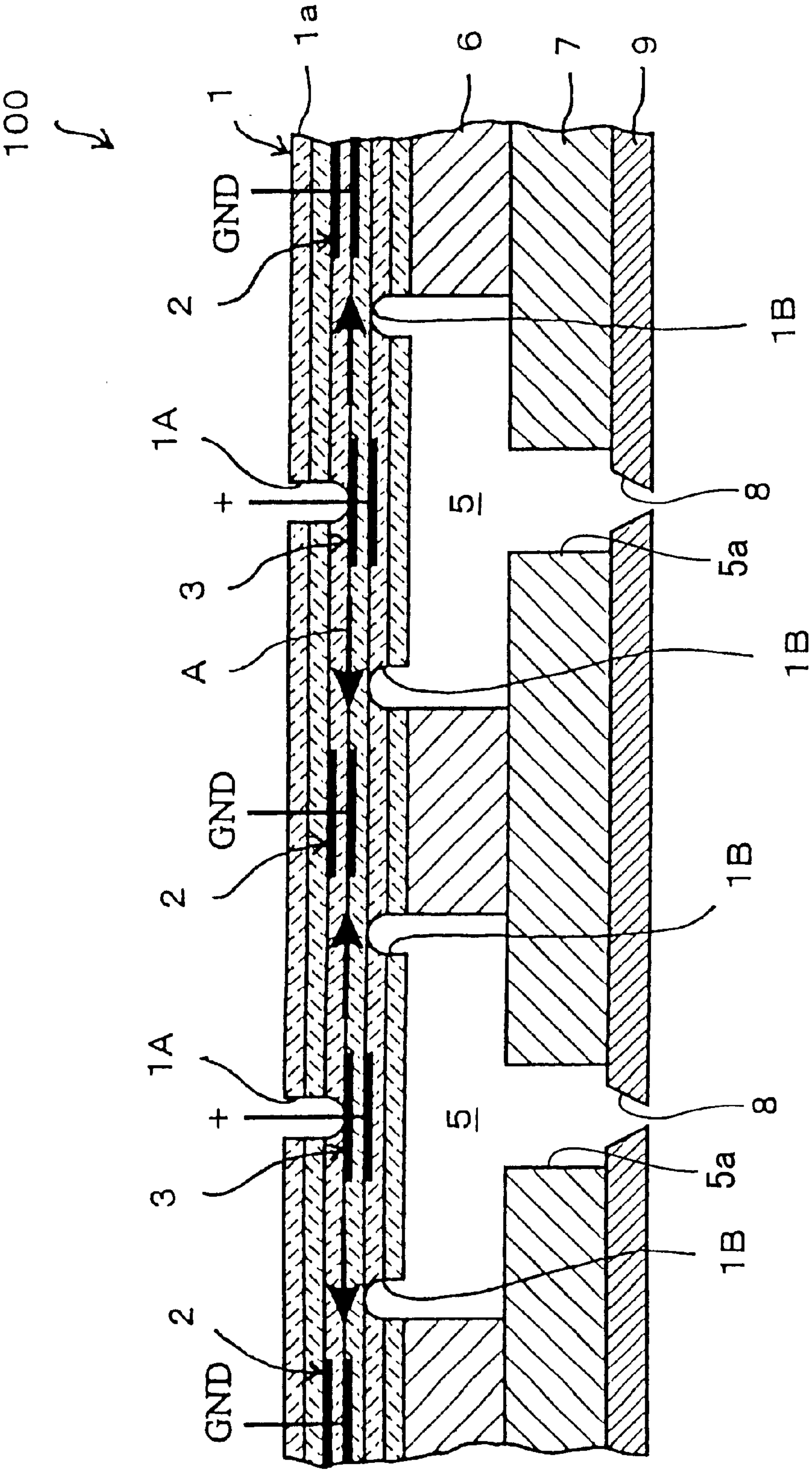
FIG. 1 is a cross-sectional view showing an ink jet printer head or a piezoelectric actuator according to a first embodiment of the present invention.

A piezoelectric actuator used as an ink jet printer head of an ink jet printer according to a first embodiment of the present invention will be described with reference to FIGS. 1 through 5(*b*). The ink jet printer head 100 includes a piezoelectric element lamination 1, first and second electrodes 2 and 3 provided in the lamination 1, a first ink chamber plate 6, a second ink chamber plate 7, and a nozzle plate 9, those stacked one after another in this order. The lamination 1 is constituted by a plurality of sheet like piezoelectric elements or piezoelectric sheets 1*a*. In the illustrated embodiment, six piezoelectric elements are laminated. The first ink chamber plate 6 is formed with a plurality of through holes (simply referred to as "holes" in the appended claims) for defining a plurality of ink chambers 5. Each solid portion of the first ink chamber plate 6 will be referred to as "partition portion" in appended claims. The second ink chamber plate 7 is formed with a plurality of through holes serving as ink ejection holes 5*a* each in communication with each ink chamber 5. Each diameter of each through hole in the second ink chamber plate 7 is smaller than each diameter of each through hole in the first ink chamber plate 6. The second ink chamber plate 7 is also formed with an ink supply passage 5*b* (FIG. 3) for introducing ink to each ink chamber 5. The combination of the lamination 1, the first ink chamber plate 6 and the second ink chamber plate 7 defines the ink chamber 5. The nozzle plate 9 is formed with a plurality of nozzles 8 each positioned in communication with each ink ejection hole 5*a*. In other words, the piezoelectric element lamination 1 closes each one open end of each through hole of the first ink chamber plate 6, and the second ink chamber plate 7 closes each another open end of each through hole of the first ink chamber plate 6, to thus define each ink chamber 5. The piezoelectric lamination 1 is supported by the first ink chamber plate 6, and is deformable such that an edge of each supporting area serves as a fulcrum. This supporting area will be referred to as "fixed position" in appended claims. Further, a combination of the first and second ink chamber plates 6, 7 and the nozzle plate 9 will be referred to as "liquid chamber constituting member" in appended claims.

Each first electrode (boundary electrode or secondary electrode) 2 is provided in association with each ink chamber 5 and is positioned above each supporting area of the first ink chamber plate 6. Each first electrode 2 is constituted by an electrical connection between two identical electrode patterns formed at two piezoelectric sheet layers 1*a* at an intermediate area of the lamination 1 in its thickness direction. As shown in FIG. 1, two electrode patterns of the first electrode 2 are aligned with each other in a thickness direction of the lamination.

Each second electrode (center electrode) 3 is provided in association with each ink chamber 5 and is positioned in alignment with each center of each ink chamber 5. Each second electrode 3 is constituted by an electrical connection between two identical electrode patterns formed at two piezoelectric sheet layers 1*a* at an intermediate area of the lamination 1 in its thickness direction. As shown in FIG. 1, two electrode patterns of the second electrode 3 are aligned with each other in a thickness direction of the lamination.

Upon application of voltage between the first and second electrodes 2 and 3, the piezoelectric lamination 1 is deformed, so that a part of the ink retained in the ink chamber 5 is forced to the nozzle 8 through the ink ejection passage 5*a*, and is ejected out of the nozzle 8. Further, ink in an amount equal to the ink ejection amount is supplied to the ink chamber 5 through the ink supply passage 5*b*. One boundary electrode 2 also serves as a boundary electrode for the adjacent ink chamber 5.

Figure 2:
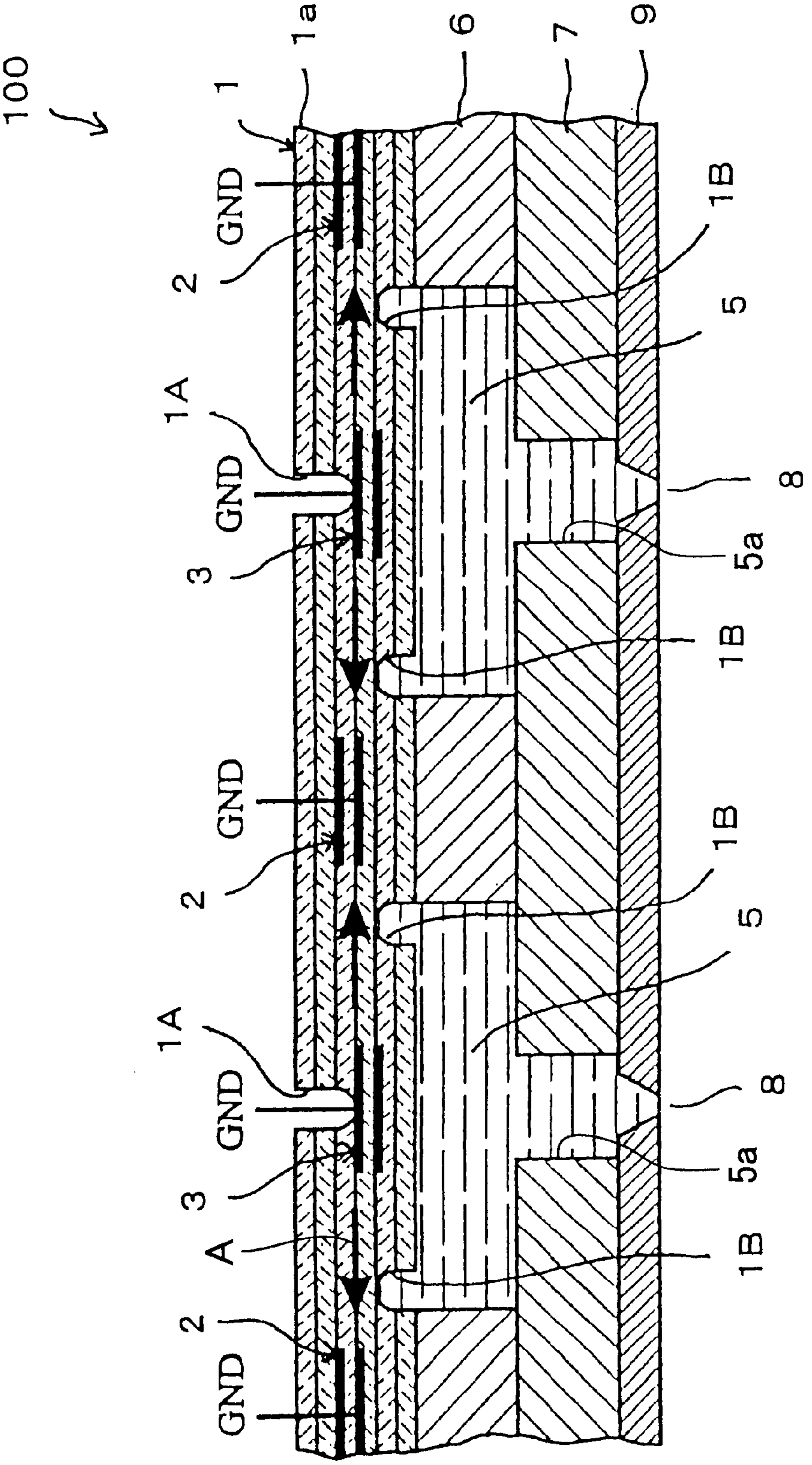
FIG. 2 is a cross-sectional view showing the ink jet printer head and showing the state where an ink is filled in ink chambers according to the first embodiment.
Figure 3:
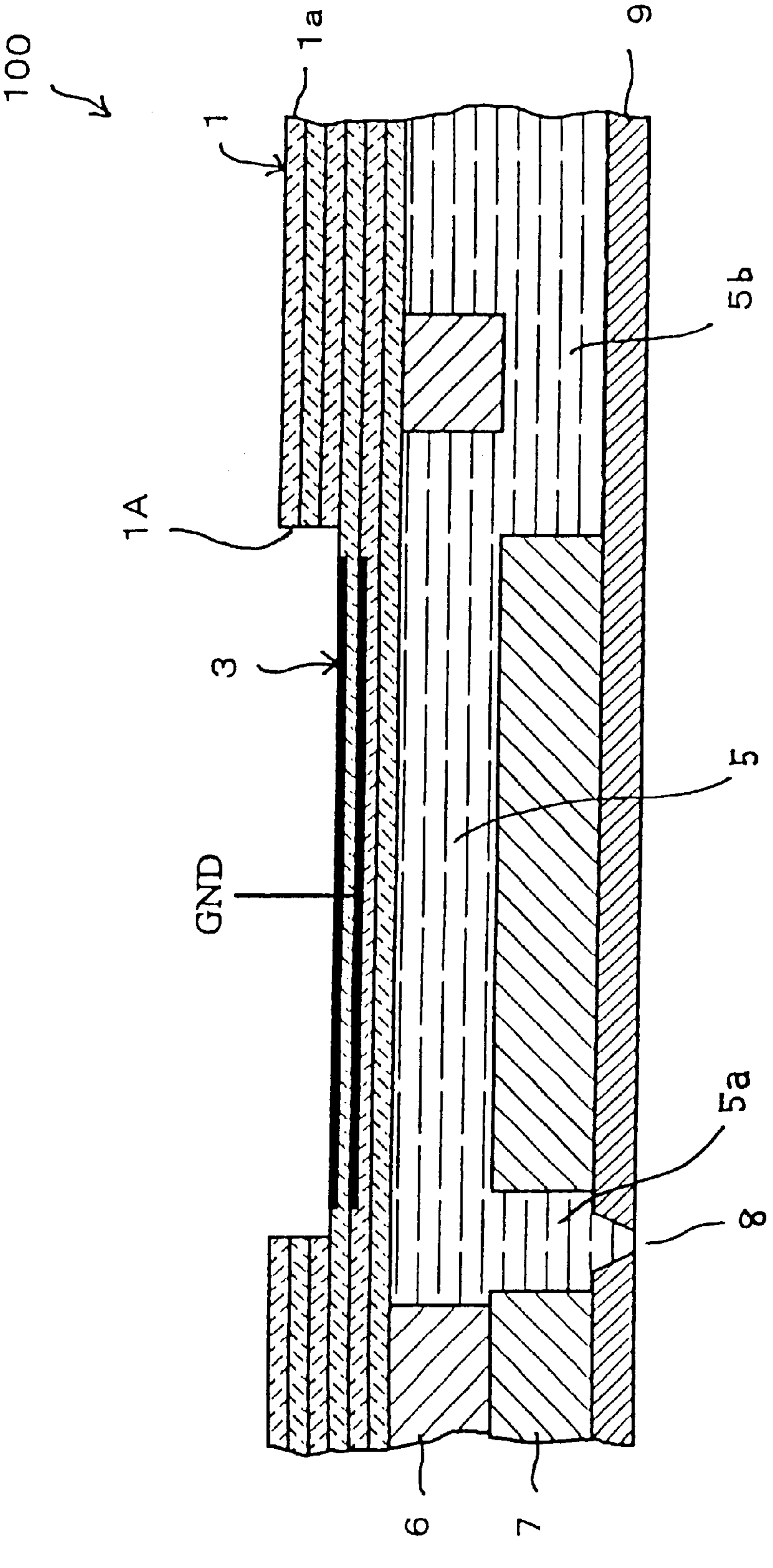
FIG. 3 is a cross-sectional view showing ink communication between an ink supply passage and an ink discharge passage in the ink jet printer head according to the first embodiment.

As shown in FIGS. 1 through 3, a plurality of outer grooves or notches 1A are formed at positions above the second electrodes 3. (Each notch will be referred to as "vacant zone" in claims.) Each outer groove 1A extends along a length of each second electrode 3 and is open at an outer side of the lamination, the outer side being a side opposite to the ink chamber 5. Further, a plurality of inner grooves or notches 1B are formed at positions between the first and second electrodes 2 and 3 at positions in alignment with a contour of the ink chambers 5. Each inner groove 1B extends along a length of the outer groove 1A and has a length equal to that of the outer groove 1A and is open at an inner side of the lamination, the inner side being in confrontation with the ink chamber 5. Moreover, longitudinal positions of the outer and inner grooves 1A and 1B are coincident with each other, the longitudinal position being leftward/rightward direction in FIG. 3. Incidentally, structures for electrical connection between the electrode patterns in the first and second electrodes 2 and 3, and a lead line structure to each electrode can be selected among various conventional manners.

In FIGS. 1 through 3, arrows A delineated in the piezoelectric lamination 1 show a direction of polarization of the piezoelectric lamination 1. As shown, the polarizing direction is coincident with the planner direction of the piezoelectric lamination 1, that is, the direction connecting the first and second electrodes 2 and 3.

Figure 4:
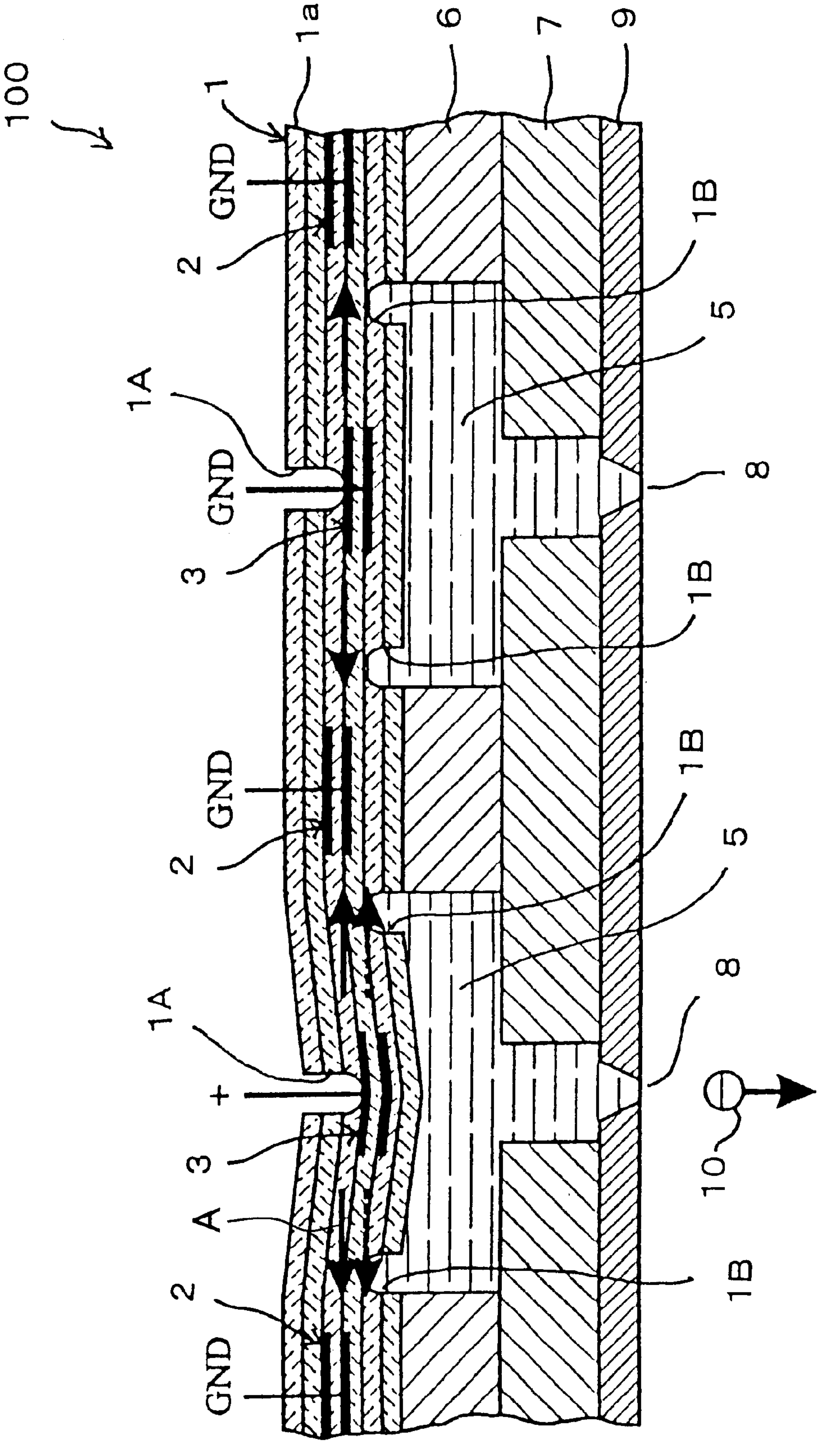
FIG. 4 is a cross-sectional view showing the state where a driving voltage is applied in the ink jet printer head according to the first embodiment.

In operation, ink is first filled in the ink chambers 5 as shown in FIGS. 2 and 3. In this case, the first and second electrodes 2 and 3 are grounded (O volt). Next, a positive voltage is applied to a specific second electrode 3 while the first electrodes 2 are grounded as shown in FIG. 4. In this case, the piezoelectric lamination 1 is expandingly deformed in the polarizing direction with a direct mode, because a direction of an electric field generated between the first and second electrodes 2 and 3 and the polarizing direction of the piezoelectric lamination 1 are coincident with each other. Thus, as shown in FIG. 4, a specific region of the piezoelectric lamination 1 around the specific second electrode 3 is displaced toward the nozzle 8 in accordance with the deformation of the piezoelectric lamination 1, thereby reducing an internal volume of a specific ink chamber 5 positioned in association with the specific second electrode 3. Accordingly, a predetermined amount of ink droplet 10 is elected from the chamber 5 through the nozzle 8. With this arrangement, degradation of the piezoelectric actuator is avoidable because polarization is not lowered upon application of the driving voltage. Moreover, the electrodes for polarization and for applying the driving voltage can be used commonly.

As shown in FIGS. 1 through 4, in the liquid droplet ejection device 100 according to the first embodiment, the expanding and shrinking direction of the piezoelectric lamination 1 is approximately equal to the polarizing direction thereof, i.e., the plane direction thereof. According to the expansion, the region of the piezoelectric lamination 1 around the second electrode 3 can be deformed toward the nozzle 8 upon deformation of the lamination 1 in the polarizing direction, because the piezoelectric lamination 1 is formed with the outer grooves 1A and volumes of the spaces of the grooves can be easily reduced. Deforming manner of the lamination 1 will be described in more detail with reference to FIGS. 5(*a*) and 5(*b*) which show an operation principle of a part of the lamination 1 defining a wall of one ink chamber 5. This lamination part in direct confrontation with the ink chamber will be referred to as "part of the piezoelectric plate member" or "deformable part" in the appended claims. In FIG. 5(*a*), a member 1' stands for a part of the lamination 1, the part defining a wall of one ink chamber 5. The member 1' is formed with a groove 1A' corresponding to one outer groove 1A for the ink chamber 5. Each end of the member 1' is fixed to each wall 6' corresponding to the first ink chamber plate 6. Because the piezoelectric lamination 1 is supportedly fixed to the first is ink chamber plate 6, the fixed portions can be simulated to the relationship between the member 1' and walls 6'.

The member 1' can be internally subjected to stretching force in a direction A upon application of electric field, which is similar to the stretching of the piezoelectric lamination 1 in the plane direction of the piezoelectric elements 1*a*. However, because the walls 6' and 6' prevents the member 1' from its linear expansion, the member 1' is urged to be deformed as shown in FIG. 5(*b*). This deformation can be more easily understood when assuming a condition where compression force is applied to each end of the member 1' in a direction B opposite to the direction A. By such a compression, the member 1' can be deformingly buckled to a side where no groove 1A' is formed. This deformation can be accelerated by the formation of grooves 1B' at each end of the member 1', the groove 1B' corresponding to inner grooves 1B.

In the first embodiment, the important factors are the inherently stretching direction A of the piezoelectric lamination 1 (i.e., plane direction of the lamination) and the formation of the groove 1A. Particularly, if the groove 1A is positioned in alignment with the center of the ink chamber 5, the greatest deformation can result. Further, the inner grooves 1B, 1B positioned at a contour of the ink chamber 5 can assist or promote the deformation.

The displacement distance or amount of the part of the lamination toward the nozzle is greater than the displacement distance or amount of the lamination in the polarizing direction. Therefore, deformation amount of the piezoelectric lamination in the polarizing direction, the amount being required for volumetric change of the ink chamber 5 can be reduced to thus lower the necessary driving voltage level. Consequently, the ink jet printer head 100 can improve energy efficiency required for ink ejection, and can be produced at a low cost.

Next, a method for producing the ink jet printer head 100 will be described. The piezoelectric lamination 1 can be produced by stacking a plurality of piezoelectric green sheets one after another and by baking the green sheets stack. Electrically conductive past materials are printed on several green sheets at a predetermined pattern. Upon baking the stacked green sheets, first and second electrodes are formed corresponding to these printed patterns. Each green sheet is formed with openings. Upon stacking the green sheets, openings in the stacked green sheets are aligned with each other to provide the outer and inner grooves 1A and 1B. Thus, upon baking the green sheets, each green sheet becomes the piezoelectric sheet 1*a*, and the electrodes 2 and 3 and outer and inner grooves 1A, 1B can be formed concurrently with the formation of the lamination 1.

Then, direct current voltage is applied between the first and second electrodes 2 and 3 for polarization of the piezoelectric lamination 1. To be more specific, the first and second electrodes 2 and 3 are connected to a negative voltage and a positive voltage, respectively, to generate an electric field between the first and second electrodes 2 and 3 in order to generate polarization in the direction of arrows A in FIG. 1. The polarizing direction is approximately the same as the plane direction of the lamination. Further, the electrodes used for polarization are commonly used for driving the piezoelectric lamination 1. Thus, direction of the electric field is coincident with the polarizing direction upon actuation of the piezoelectric lamination 1.

Next, the piezoelectric lamination 1, the first ink chamber plate 6, the second ink chamber plate 7, and the nozzle plate 9 are successively stacked to provide the ink jet printer head 100. Incidentally, the final stacking process can be performed prior to polarization process to the piezoelectric lamination 1.

As described above, in the liquid droplet ejection device according to the first embodiment, the piezoelectric lamination 1 is formed with outer grooves 1A at a position opposite to and at the center of the ink chamber 5 and inner grooves 1B at a position in confrontation with and at the contour of the ink chamber 5. Therefore, the part of the lamination 1 constituting the wall of the ink chamber can be easily deformed and displaced in accordance with the deformation of the piezoelectric lamination 1. This is advantageous in reducing driving voltage, to thus provide an energy saving printer head. Further, because the first and second electrodes 2 and 3 are positioned within the lamination 1, these electrodes do not exposed to ink, so that degradation of the electrodes is avoidable. Further, the shape and position of the electrodes can be changed in an optimum manner, because the piezoelectric plate member is provided by lamination.

A liquid droplet ejection device according to a second embodiment of the present invention will be described with reference to FIG. 6. The printer head 200 includes a piezoelectric lamination 21 including a plurality of piezoelectric sheets 21*a*, first and second electrodes 22, 23, first and second ink chamber plates 26, 27 and a nozzle plate 29. The combination of these members defines a plurality of ink chambers 25 and a plurality of nozzles 28. This arrangement is the same as that of the first embodiment except positions of outer and inner grooves 21A and 21B.

That is, a plurality of outer grooves 21A are formed at positions in alignment with the first electrodes 22. Each outer groove 1A extends along a length of each first electrode 22 and is open at an outer side of the lamination, the outer side being a side opposite to the ink chamber 25. Further, a plurality of inner grooves 21B are formed at positions in alignment with the second electrodes 23 and the nozzles 28. Each inner groove 21B extends along a length of the second electrode 23 and has a length equal to that of the outer groove 21A and is open at an inner side of the lamination 21, the inner side being in confrontation with the ink chamber 25. Moreover, longitudinal positions of the outer and inner grooves 21A and 21B are coincident with each other.

Figure 6:
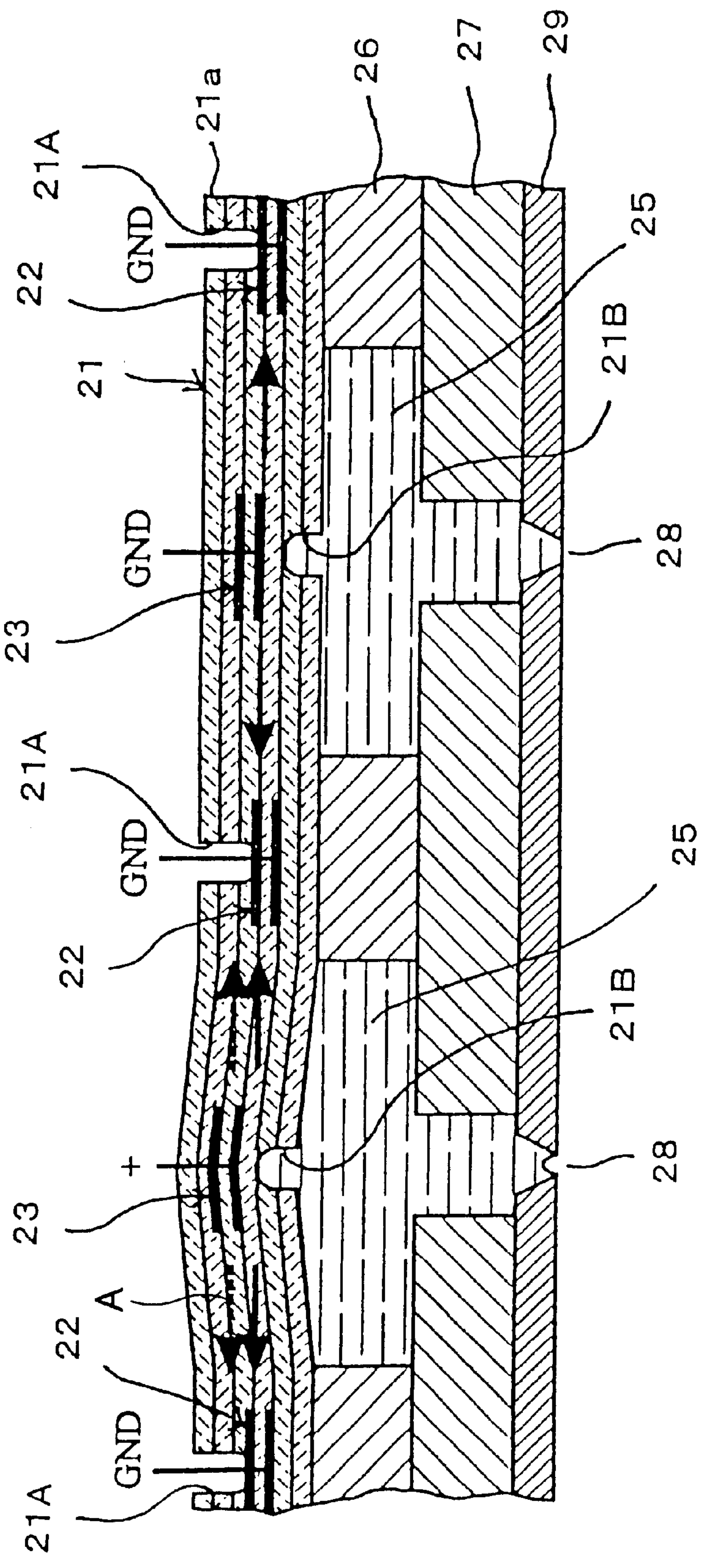
FIG. 6 is a cross-sectional view showing an ink jet printer head according to a second embodiment of the present invention.

In operation, while ink is filled in the ink chambers 25 as shown in FIG. 6, a positive voltage is applied to a specific second electrode 23 while the first electrodes 22 are grounded. In this case, expansion force is applied to the piezoelectric lamination 21 in the polarizing direction with a direct mode, because a direction of an electric field generated between the first and second electrodes 22 and 23 and the polarizing direction of the piezoelectric lamination 21 are coincident with each other. Thus, as shown in FIG. 6, a specific region of the piezoelectric lamination 21 around the specific second electrode 23 is displaced away from the nozzle 28 in accordance with the deformation of the piezoelectric lamination 21, thereby increasing an internal volume of a specific ink chamber 25 positioned in association with the specific second electrode 23.

Next, the specific second electrode 23 is grounded while maintaining grounded condition of the first electrode 22, so that the piezoelectric layer 21 is restored its original flat shape, thereby deceasing the volume of the ink chamber 25. Consequently, predetermined amount of ink is ejected out of the ink chamber 25 through the nozzle 28. The combination of the outer and inner grooves 21A and 21B can facilitate deformation of the part of the piezoelectric lamination 21, the part functioning as a wall of the ink chamber 25.

Figure 7:
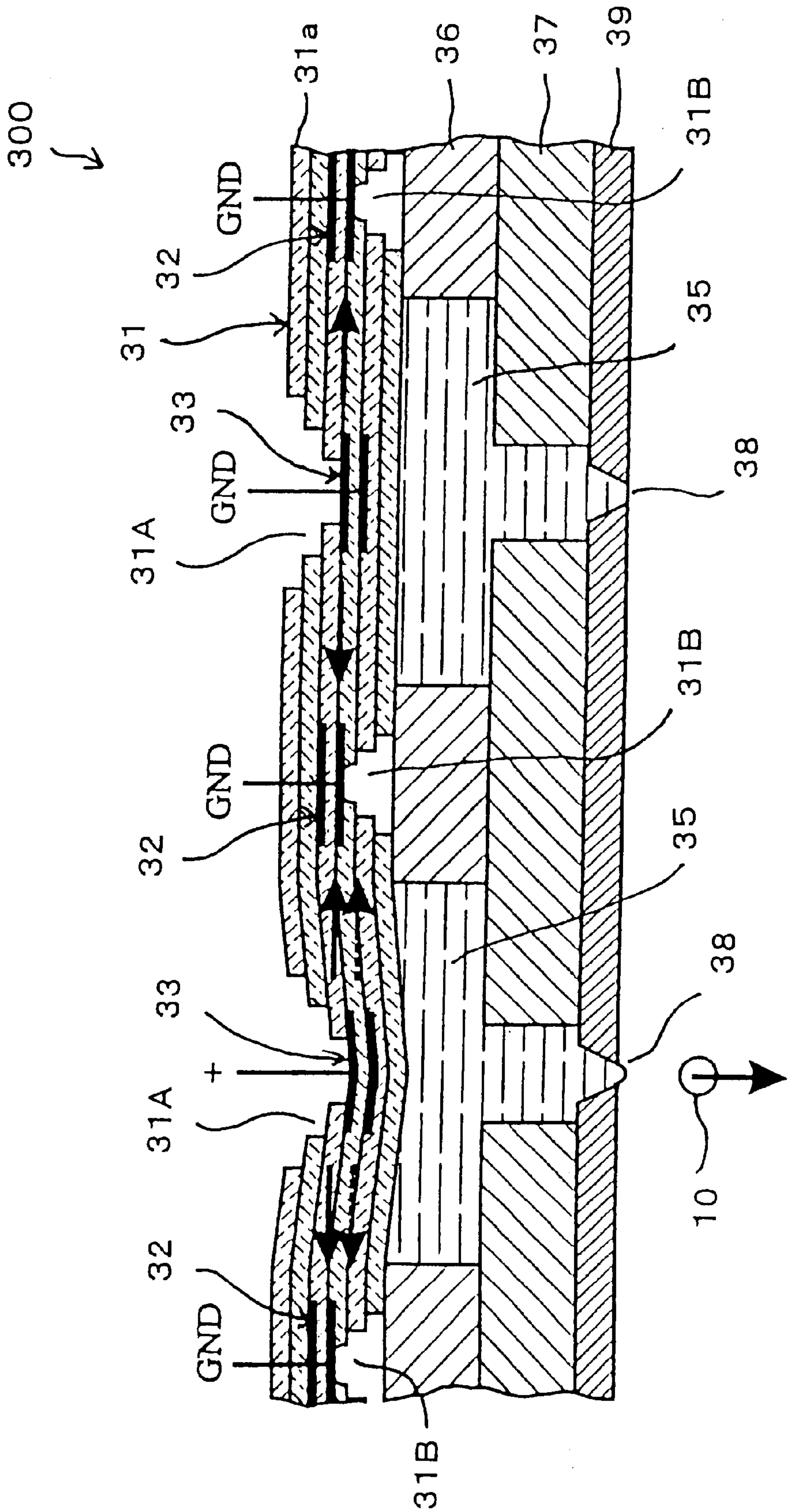
FIG. 7 is a cross-sectional view showing an ink jet printer head according to a third embodiment of the present invention.

A liquid droplet ejection device according to a third embodiment of the present invention is shown in FIG. 7. The printer head 300 includes a piezoelectric lamination 31 including a plurality of piezoelectric sheets 31*a*, first and second electrodes 32, 33, first and second ink chamber plates 36, 37 and a nozzle plate 39. The combination of these members defines a plurality of ink chambers 35 and a plurality of nozzles 38. This arrangement is the same as that of the first embodiment except positions of the inner grooves 31B and configurations of the outer and inner grooves 31A, 31B.

That is, as shown in FIG. 7, a plurality of outer grooves 31A are formed at positions in alignment with the second electrodes 33 and the nozzles 38. Each outer groove 31A has a tapered cross-section and extends along a length of each second electrode 33 and is open at an outer side of the lamination 31, the outer side being a side opposite to the ink chamber 35. Further, a plurality of inner grooves 31B are formed at positions in alignment with the first electrodes 32. Each inner groove 31B has a tapered cross-section and extends along a length of the first electrodes 32 and has a length equal to that of the outer groove 31A. Each inner groove 31B are positioned offset from each ink chamber 35 and is closed by the first ink chamber plate 36. Moreover, longitudinal positions of the outer and inner grooves 31A and 31B are coincident with each other. A filler providing an elastic coefficient lower than that of the piezoelectric lamination 31 can be filled in each confined space of the inner groove 31B.

In operation, while ink is filled in the ink chambers 35 as shown in FIG. 7, a positive voltage is applied to a specific second electrode 33 while the first electrodes 32 are grounded. In this case, linear expansion force is applied to the piezoelectric lamination 31 in the polarizing direction with a direct mode, because a direction of an electric field generated between the first and second electrodes 32 and 33 and the polarizing direction of the piezoelectric lamination 31 are coincident with each other. Thus, as shown in FIG. 7, a specific region of the piezoelectric lamination 31 around the specific second electrode 33 is displaced toward the nozzle 38 in accordance with the deformation of the piezoelectric lamination 31, thereby reducing an internal volume of the specific ink chamber 35 positioned in association with the specific second electrode 33. Consequently, predetermined amount of ink droplet 10 is ejected out of the ink chamber 35 through the nozzle 38.

Figure 8:
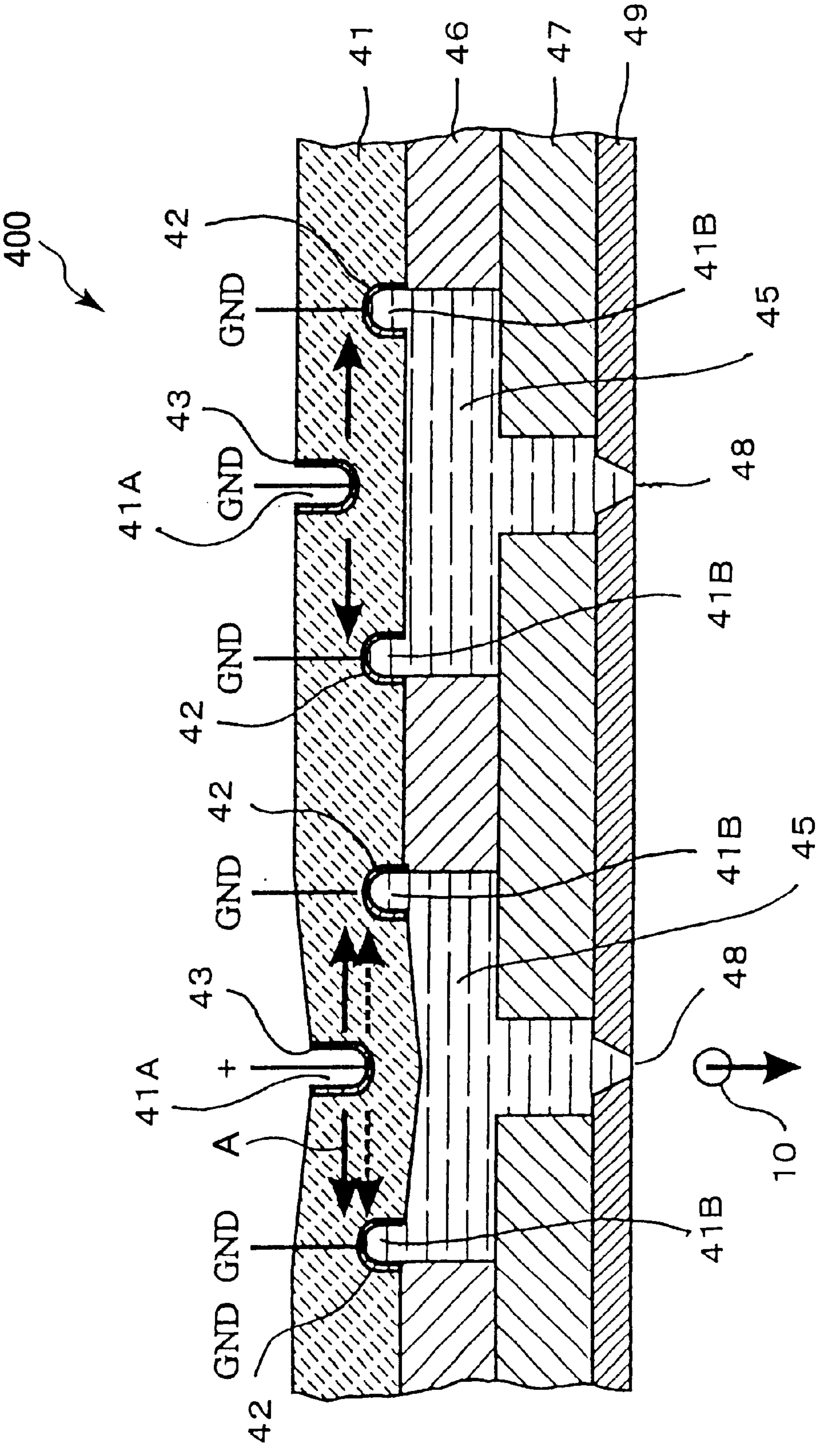
FIG. 8 is a cross-sectional view showing an ink jet printer head according to a fourth embodiment of the present invention.

A liquid droplet ejection device according to a fourth embodiment of the present invention is shown in FIG. 8. The printer head 400 includes a piezoelectric plate member 41, first and second electrodes 42, 43, first and second ink chamber plates 46, 47 and a nozzle plate 49. The combination of these members defines a plurality of ink chambers 45 and a plurality of nozzles 48. This arrangement is the same as that of the first embodiment except that the piezoelectric plate member 41 is not a laminating construction but an integral one-piece member, and shape of the first and second electrodes 42 and 43 is not a flat plane but is U-shape in cross-section. The piezoelectric plate member 41 is produced by integrally sintering a piezoelectric material.

Like the first embodiment, each outer groove 41A is formed in alignment with each center of the ink chamber 45 and each nozzle 48 and is open at an outer side of the piezoelectric plate member 41, the outer side being a side opposite to the ink chamber 45. Further, each inner groove 41B is positioned in alignment with a contour of the ink chambers 45 and is open to the ink chamber 45. Therefore, highly flexible portion of the piezoelectric plate member 41 can be provided as a wall of the ink chamber 45 similar to the first embodiment.

Each first electrode 42 has a U-shape in cross-section in conformance with the cross-sectional shape of the inner groove 41B and is positioned at the inner groove 41B. Each first electrode 42 is exposed to the ink chamber 45. Further, each second electrode 43 also has a U-shape in cross-section in conformance with the cross-sectional shape of the outer groove 41A and is positioned at the outer groove 41A. Length of the outer and inner grooves 41A and 41B are equal to each other. Each second electrode 43 is exposed to an outside. Further, longitudinal positions of the outer and inner grooves 41A and 41B are coincident with each other. In this embodiment, each second electrode 43 are exposed to outside, connection of a lead line to the second electrode 43 can be easily performed.

In operation, while ink is filled in the ink chambers 45, a positive voltage is applied to a specific second electrode 43 while the first electrodes 42 remains grounded. In this case, linear expansion force is applied to the piezoelectric plate member 41 in the polarizing direction with a direct mode, because a direction of an electric field generated between the first and second electrodes 42 and 43 and the polarizing direction of the piezoelectric plate member 41 are coincident with each other. Thus, as shown in FIG. 8, a specific region of the piezoelectric plate member 41 around the specific second electrode 43 is displaced toward the nozzle 48 in accordance with the deformation of the piezoelectric plate member 41, thereby reducing an internal volume of the specific ink chamber 45 positioned in association with the specific second electrode 43. Consequently, predetermined amount of ink droplet 10 is ejected out of the ink chamber 45 through the nozzle 48.

Incidentally, each outer and inner grooves 41A, 41B can be formed by cut-machining a piezoelectric material compact prior to sintering or cutting the sintered piezoelectric plate member. Further, each inner and outer electrodes 42, 43 can be formed by patterning electrode material at the inner and outer grooves 41B, 41A by way of various printing methods, vacuum deposition method or by using a dispenser.

Figure 9:
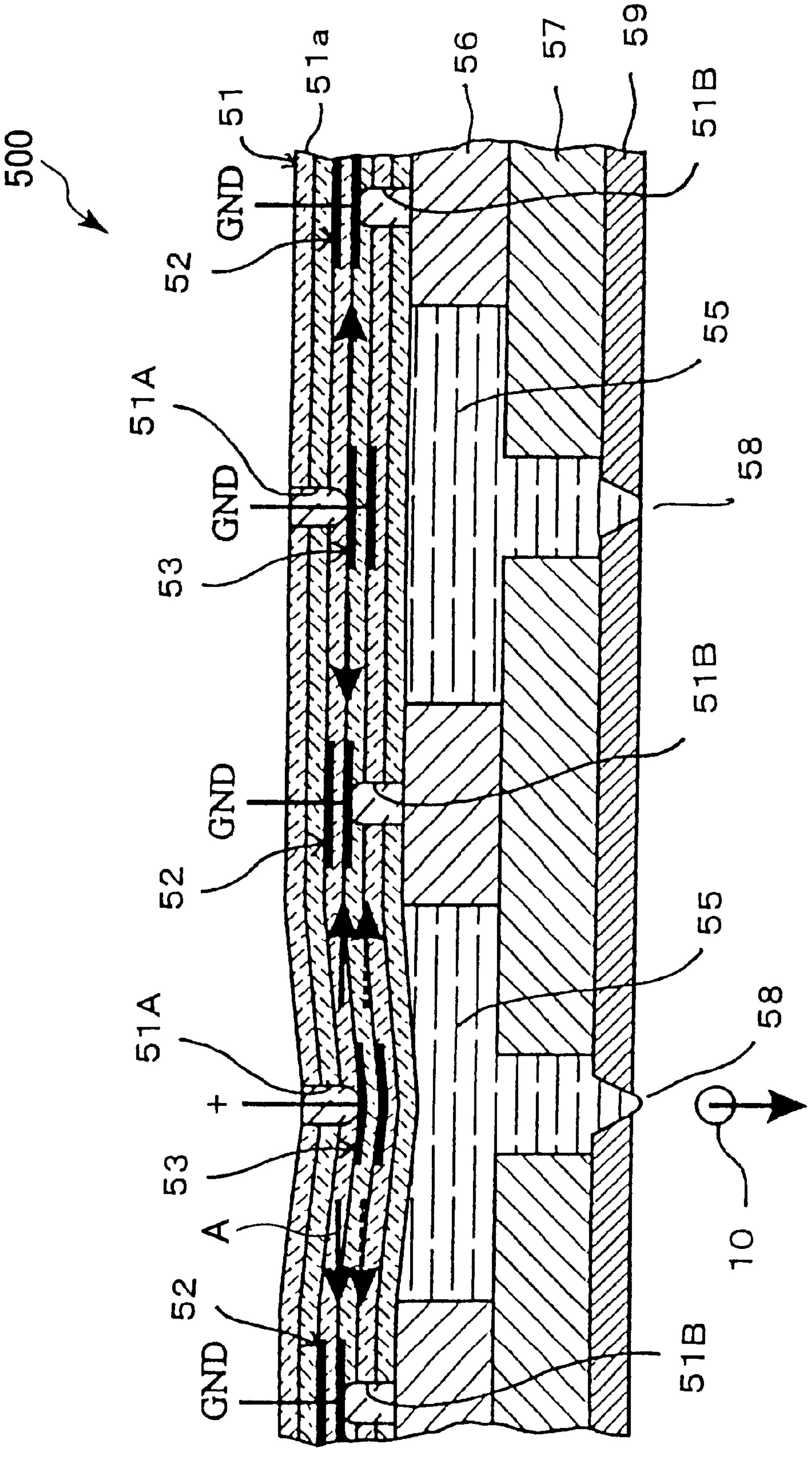
FIG. 9 is a cross-sectional view showing an ink jet printer head according to a fifth embodiment of the present invention.

A liquid droplet ejection device according to a fifth embodiment of the present invention is shown in FIG. 9. The printer head 500 includes a piezoelectric lamination 51 including a plurality of piezoelectric sheets 51*a*, first and second electrodes 52, 53, first and second ink chamber plates 56, 57 and a nozzle plate 59. The combination of these members defines a plurality of ink chambers 55 and a plurality of nozzles 58. This arrangement is the same as that of the third embodiment except of the shape of the inner and outer grooves 51B, 51A.

That is, as shown in FIG. 9, each outer and inner groove 51A, 51B do not have a tapered cross-section but have parallel groove walls. Like the third embodiment, each inner groove 51B is closed by the first ink chamber plate 56, and a filler which is the same as that used in the third embodiment can be filled in the confined space of each inner groove 51B. Operation of the liquid droplet ejection device of the fifth embodiment is the same as that of the third embodiment.

Similar to the first embodiment, according to the second to fifth embodiments, the expanding and shrinking direction of the piezoelectric laminations 21, 31, 51 and the piezoelectric plate member 41 is approximately equal to the polarizing direction of the piezoelectric laminations or the piezoelectric plate member, i.e., the plane direction thereof. However, specific regions of the piezoelectric laminations or member is deformed away from the nozzle 28 (FIG. 6) or toward the nozzles 38, 48, 58 (FIGS. 6 through 8) upon deformation of the piezoelectric laminations or the piezoelectric plate member, because the piezoelectric laminations and the piezoelectric plate member are formed with the outer grooves 21A, 31A, 41A, 51A, and inner grooves 21B, 31B, 41B, 51B and volumes of the spaces of these grooves can be easily changed or reduced.

This displacement distance or amount toward the nozzle or away from the nozzle at the part of the lamination or the piezoelectric plate member is greater than the displacement distance or amount of the lamination or the member in the polarizing direction. Therefore, deformation amount of the piezoelectric lamination or piezoelectric plate member in the polarizing direction, the amount being required for volumetric change of the ink-chamber 25, 35, 45, 55 can be reduced to thus lower the necessary driving voltage level. Consequently, the ink jet printer head 200, 300, 400, 500 can also improve energy efficiency required for ink ejection, and can be produced at a low cost.

If the grooves are positioned at a center of the ink chamber, the piezoelectric lamination or the piezoelectric plate member can provide the largest deformation provided that the applied driving voltage level is the same.

Incidentally, the method for producing the printer heads according to the second, third and fifth embodiments is the same as the method in the first embodiment.

FIG. 10 shows an essential portion of an ink jet printer in which one of the liquid droplet ejection devices in the above described embodiments is installed. A platen 110 serving as a sheet feeding member is rotatably supported by a printer frame 113 through a shaft 112. A line feed motor 114 is fixed to the frame 113 and a gear train is provided between the motor 114 and the shaft 112 for rotating the platen 110 about an axis of the shaft 112 so as to feed a sheet 111 in a sheet feeding direction. A pair of guide rods 120 extend from the frame 113 in parallel with the platen 110, and a carriage 118 is slidably movably supported on the pair of guide rods 120. Further, a drive pulley 122A and a driven pulley 122B are supported on the frame 113, and a timing belt 124 is mounted between the pulleys 122A and 122B. The timing belt 124 is connected to the carriage 118, and the drive pulley 122A is driven by a drive motor 123. Upon rotation of the drive motor 123, the timing belt 124 runs in parallel with the guide rods 120 so that the carriage 118 is moved along the platen 110.

In the piezoelectric ink jet recording head, an ink tank and an ink supplying device 116 connecting the head to the tank are mounted on the carriage 118. The ink supply device 116 has a connecting potion in which an ink passage is formed for supplying ink from the ink tank to the head. The ink jet recording head, the ink tank and the connecting portion can be provided integrally or separately. Further, the only the ink jet printer head can be installed on the carriage 118, or the head and the connecting portion can be installed on the carriage 118.

The ink tank can be exchangeably provided on the carriage. If the printer head is not exchangeable with respect to the carriage, only the ink tank should be exchangeable. In this case, the ink jet printer head should provide a prolonged durability, because the head must be used after exchange of the ink tank with a new tank.

An ink tank and a printer head can be provided as an integral ink unit. The unit is provided with a drive signal receiving connector portion where each signal line for each ink chamber is exposed. On the other hand, a carriage is provided with a drive signal transmission connector portion where each signal line for outputting head drive signal to each ink chamber is exposed. When the ink unit is installed in the carriage, each signal line of the drive signal receiving connector portion of the ink unit can be connected to the corresponding each signal line of the drive signal transmission connector portion of the carriage. Accordingly, each ink chamber can be actuated upon receiving a head drive signal transmitted from a printer controller.

According to this structure, when ink in the ink tank is used up, the ink unit is exchanged with a new ink unit. Therefore, the ink jet printer head should only provide a durability during which the ink is used up. Consequently, the head can be produced at a lower cost in comparison with a case where only the ink tank is exchanged. Moreover, a structure of an ink passage connecting between the tank and the head can be simplified within the ink unit, to lower the production cost of the unit. Further advantage can be found in the ink unit, because the ink head is not exposed to atmosphere. Such exposure occurs if only the ink tank is to be exchanged against the head, and such exposure may lower the ink ejection efficiency.

While the invention has been described in detail with reference to specific embodiments thereof, it would be apparent to those skilled in the art that various changes and modifications may be made therein without departing from the spirit and scope of the invention.

For example, each second electrode can be provided at an outmost surface of the piezoelectric lamination. This facilitates electrical connection of a lead line to the electrode.

Further, the liquid droplet ejection device of the present invention can also be used for various image forming device and coating and spraying device. Moreover, instead of the roller shaped platen 110, a plate line platen can be used in the ink jet printer shown in FIG. 10. In the latter case, a pair of sheet feed rollers are provided at an upstream and downstream sides of the plate like platen. Furthermore, a length of the ink jet printer head can be elongated to an entire width of the sheet to perform a simultaneous one line printing.

Further, in the illustrated embodiment, vacant zones or notches are formed at the surfaces of the piezoelectric lamination or the piezoelectric member. However, the vacant zones can be positioned within the thickness of the piezoelectric lamination or the piezoelectric member and at positions deviating to one of the upper and lower surfaces thereof.

Further, instead of the through holes formed in the ink chamber plate, mere holes or recesses are available as long as the holes or recesses can provide cavities or pressure rooms, and these are in fluid communication with the nozzles.

What is claimed is:

1. A piezoelectric actuator comprising:

a piezoelectric plate member formed of a piezoelectric material and having a first surface and a second surface opposite to the first surface in a thickness direction of the piezoelectric plate member, the piezoelectric plate member being fixed at fixed positions spaced away from each other in an extending direction of the piezoelectric plate member; and, electrodes for deforming the piezoelectric plate member, each electrode being positioned for imparting an electric field to the piezoelectric plate member so as to impart expansion force in the extending direction to a part of the piezoelectric plate member, the part being defined between neighboring fixed positions of the piezoelectric plate member, a vacant zone being provided at a position deviating to one of the first and second surfaces in the thickness direction and at a position between the neighboring fixed positions, expansion force of the part of the piezoelectric plate member in the extending direction causing the part to be bendingly deformed between the neighboring fixed positions.

2. The piezoelectric actuator as claimed in claim 1, wherein the vacant zone is positioned at a center portion between the neighboring fixed positions, the part of the piezoelectric plate member being bent toward a side opposite to the one of the first and second surfaces to which the vacant zone is deviated.

3. The piezoelectric actuator as claimed in claim 2, wherein the piezoelectric plate member is further formed with secondary vacant zone provided at a position deviating to remaining one of the first and second surfaces at a position adjacent to the fixed positions.

4. The piezoelectric actuator as claimed in claim 1, wherein the electrodes are disposed in the piezoelectric plate member and are positioned spaced away from each other in the extending direction of the piezoelectric plate member.

5. The piezoelectric actuator as claimed in claim 4, wherein the piezoelectric plate member comprises a plurality of piezoelectric sheets stacked one after another in the thickness direction, the electrodes being disposed between neighboring piezoelectric sheets.

6. The piezoelectric actuator as claimed in claim 4, wherein the electrodes includes a center electrode disposed at a center portion between the fixed positions and a boundary electrodes disposed adjacent to the fixed positions, the electric field being generated between the center electrode and the boundary electrodes.

7. The piezoelectric actuator as claimed in claim 4, wherein the piezoelectric plate member is polarized between the electrodes and in the extending direction.

8. The piezoelectric actuator as claimed in claim 1, wherein at least one of the electrodes is provided at the vacant zone.

9. The piezoelectric actuator as claimed in claim 1, wherein the piezoelectric plate member includes a plurality of deformable parts each sectioned by the fixed positions, the electrodes being provided for each of the plurality of the deformable parts.

10. The piezoelectric actuator as claimed in claim 9, wherein the electrodes includes a center electrode disposed at a center portion between the fixed positions for a specific deformable part and a boundary electrodes disposed adjacent to the fixed positions for the specific deformable part, each boundary electrode also serving as a boundary electrode for another deformable part neighboring the specific deformable part.

11. A liquid droplet ejection device comprising:

a piezoelectric actuator comprising:

a piezoelectric plate member formed of a piezoelectric material and having a first surface and a second surface opposite to the first surface in a thickness direction of the piezoelectric plate member, the piezoelectric plate member being fixed at fixed positions spaced away from each other in an extending direction of the plate member; and, electrodes for deforming the piezoelectric plate member, each electrode being positioned for imparting an electric field to the piezoelectric plate member so as to expand a part of the piezoelectric plate member in the extending direction, the part being defined between neighboring fixed positions of the piezoelectric plate member, a vacant zone being provided at a position deviating to one of the first and second surfaces in the thickness direction and at a position between the neighboring fixed positions, expansion force of the part of the piezoelectric plate member in the extending direction causing the part to be bendingly deformed between the neighboring fixed positions; and a liquid chamber constituting member defining a liquid chamber in cooperation with the part of the piezoelectric plate member, each fixed position being positioned adjacent to a contour of the liquid chamber, deformation of the part of the piezoelectric plate member providing a volumetric change of the liquid chamber.

12. The liquid droplet ejection device as claimed in claim 11, wherein the vacant zone is positioned in alignment with a center of the liquid chamber.

13. The liquid droplet ejection device as claimed in claim 12, wherein the second surface has a portion serving as a wall of the liquid chamber, the vacant zone being at a position deviating to the first surface.

14. The liquid droplet ejection device as claimed in claim 12, wherein the second surface has a portion serving as a wall of the liquid chamber, the vacant zone being at a position deviating to the second surface.

15. The liquid droplet ejection device as claimed in claim 11, wherein the electrodes are disposed in the piezoelectric plate member and are positioned spaced away from each other in the extending direction of the piezoelectric plate member, the piezoelectric plate member being polarized between the neighboring electrodes and in the extending direction.

16. The liquid droplet ejection device as claimed in claim 11, wherein the liquid chamber constituting member comprises partition portions arrayed in the extending direction for defining a plurality of liquid chambers arrayed in the extending direction, each fixed position being located at each partition portion, and each deformable part being provided for each liquid chamber.

17. The liquid droplet ejection device as claimed in claim 16, wherein the electrodes includes a center electrode positioned between neighboring partition portions, and boundary electrodes each disposed on each partition portion, an electric field being generated between the center electrode and the boundary electrodes.

18. The liquid droplet ejection device as claimed in claim 17, wherein each boundary electrode also serves as a boundary electrode for a neighboring deformable part.

19. A piezoelectric ink jet printer head comprising:

a piezoelectric plate member formed from a piezoelectric material and having a first surface and a second surface opposite to the first surface in a thickness direction of the piezoelectric plate member, the piezoelectric plate member extending in an extending direction;

an ink chamber plate positioned directly below the piezoelectric plate member and formed with a plurality of holes arrayed in the extending direction, the piezoelectric plate member being fixed to solid portions of the ink chamber plate other than the holes;

a nozzle plate positioned directly below the ink chamber plate and formed with a plurality of nozzles arrayed in the extending direction and positioned in alignment with the holes, a combination of the piezoelectric plate member, the ink chamber plate and the nozzle plate defining a plurality of ink chambers arrayed in the extending direction;

electrodes for deforming the piezoelectric plate member, each electrode being positioned for imparting an electric field to the piezoelectric plate member so as to expand a part of the piezoelectric plate member in the extending direction, the part being defined in confrontation with the ink chamber, vacant zones being positioned at positions deviating to one of the first and second surfaces and each vacant zone being positioned within a projection area of each hole, expansion force of the part of the piezoelectric plate member in the extending direction causing the part of the piezoelectric plate member to be bendingly deformed toward or away from the ink chamber.

20. The piezoelectric ink jet printer head as claimed in claim 19, wherein each vacant zone is positioned in alignment with a center of each hole, the part of the piezoelectric plate member being bent toward a side opposite to the one of the first and second surfaces to which the vacant zone is deviated.

21. The piezoelectric ink jet printer head as claimed in claim 20, wherein the piezoelectric plate member is further formed with secondary vacant zones at positions deviating to remaining one of the first and second surfaces at a position adjacent to the solid positions of the ink chamber plate.

22. The piezoelectric ink jet printer head as claimed in claim 19, wherein the electrodes are disposed in the piezoelectric plate member and are positioned spaced away from each other in the extending direction of the piezoelectric plate member.

23. The piezoelectric ink jet printer head as claimed in claim 22, wherein the piezoelectric plate member comprises a plurality of piezoelectric sheets stacked one after another in the thickness direction, the electrodes being disposed between neighboring piezoelectric sheets.

24. The piezoelectric ink jet printer head as claimed in claim 22, wherein the electrodes includes a center electrode positioned in alignment with a center of the hole and a boundary electrodes disposed adjacent to the solid positions of the ink chamber plate, the electric field being generated between the center electrode and the boundary electrodes.

25. The piezoelectric ink jet printer head as claimed in claim 22, wherein the piezoelectric plate member is polarized between the electrodes and in the extending direction.

26. The piezoelectric ink jet printer head as claimed in claim 19, wherein at least one of the electrodes is provided at the vacant zone.

* * * * *